United States Patent [19]
Besson et al.

[11] Patent Number: 5,194,820
[45] Date of Patent: Mar. 16, 1993

[54] FREQUENCY DOUBLING DEVICE

[75] Inventors: Yves Besson, Paris; Sylviane Ginguene, Sainte Genevieve des Bois, both of France

[73] Assignee: Thomson-CSF, Puteaux, France

[21] Appl. No.: 795,673

[22] Filed: Nov. 21, 1991

[30] Foreign Application Priority Data

Nov. 23, 1990 [FR] France .................................. 90 14619

[51] Int. Cl.⁵ .................... H03B 19/00; H03L 7/00
[52] U.S. Cl. .................................. 328/20; 307/271
[58] Field of Search ............................ 328/15, 16, 20; 307/271, 264, 219.1

[56] References Cited

U.S. PATENT DOCUMENTS

| | | | |
|---|---|---|---|
| 3,030,566 | 4/1962 | Collins | 307/219.1 |
| 3,398,297 | 8/1968 | Huen | 328/20 |
| 3,681,705 | 8/1972 | Spence | 307/219.1 |

FOREIGN PATENT DOCUMENTS 2631758 11/1989 France .

OTHER PUBLICATIONS

*International Journal of Electronics,* vol. 44, No. 5, May 1978, pp. 461–464, R. W. J. Barker, "Translinear Frequency Doubler".
*IEEE Journal of Solid-State Circuits,* vol. SC11, No. 2, Apr. 1976, pp. 341–343, S. Ashok, "Integratable Sinusoidal Frequency Doubler".
*IEEE Transactions on Instrumentation and Measurement,* vol. 37, No. 2, Jun. 1988, pp. 259–262, W. Surakampontorn, "Sinusoidal Frequency Doublers Using Operational Amplifiers".
Patent Abstracts of Japan, vol. 8, No. 95 (E-242), May 2, 1984, & JP-A-59 13 416, Jan. 24, 1984, Y. Masayuki, "Waveform Shaping Circuit".

*Primary Examiner*—William L. Sikes
*Assistant Examiner*—Sinh Tran
*Attorney, Agent, or Firm*—Oblon, Spivak, McClelland, Maier & Neustadt

[57] ABSTRACT

The field of the invention is that of frequency doublers. More precisely, the present invention concerns a low noise frequency doubler, which in particular can operate at frequencies of the order of several GHz, or even of several tens of GhZ. According to the invention, the frequency doubler, operating in particular in the microwave range, is of the type including means of phase shifting to obtain two signals with a phase difference of 180° from an input signal of frequency F and means for amplifying each of these two signals, the output signal of frequency 2F formed by adding the said amplified signals, the said means of amplification cooperating with means for varying the gain of the said means of amplification to make the gain of the said means of amplification practically proportional to the amplitude of the said amplified signals.

9 Claims, 2 Drawing Sheets

FREQUENCY DOUBLING DEVICE

BACKGROUND OF THE INVENTION

The domain of the invention is that of frequency doubling devices. More precisely, the present invention concerns a low noise frequency doubler which in particular can function at frequencies of the order of several GHz, even several tens of GHz.

Frequency doubling devices which can operate at these frequencies are used in particular in radar and in instruments generating and synthesizing frequencies in order to generate stable high frequencies from low frequency source which are also stable.

The low frequency (LF) signal may for example be obtained from a quartz oscillator which provides a very stable low frequency. The use of frequency doubling devices in series leads to a rapid increase in the frequency of the signal and provides a high frequency signal of stable frequency. In order to reduce the number of multiplications necessary to reach the desired high frequency, it is advantageous to have available a stable LF source with relatively high frequency.

Most frequency doubling devices used are based on the introduction of a distortion of an input sine wave signal at frequency F to enrich the spectrum and thus create harmonic frequencies of the input frequency: 2F, 3F, 4F, etc. Selective filtering then enables the desired harmonic to be recovered, provided it was generated with sufficient amplitude. In the case of frequency doublers, the 2F harmonic is selected.

Depending on the operation performed to distort the input sine wave signal (chopping the top, rectification, chopping the bottom, etc.) and the way in which this is done, the desired harmonics may be generated. In general, the efficiency of this operation is more or less satisfactory and some attenuation in the phase and/or amplitude of the noise spectrum is achieved.

Different types of devices capable of generating multiple frequencies from an LF signal are known.

One may for example use a "snap-off" diode which stores all the energy of one period of a sine wave signal of frequency F applied to it, restoring the energy in the form of a Dirac pulse, i.e. in a very short time period. Since the spectral width of the signal obtained is very broad, the signal must be filtered in order to extract the harmonic of the desired frequency, for example 2F.

The main disadvantage of this type of device is that the noise level introduced is relatively high and is not suitable for low noise applications.

Another method used to increase the frequency of a signal makes use of the fact that an input signal of frequency F multiplied by itself provides a signal whose amplitude is equal to the square of that of the input signal and whose frequency is doubled. Since the multiplication of a signal by itself enables the frequency to be doubled, a signal of several tens of GHz can be obtained from a low frequency signal of several tens of MHz.

One can for example use a mixer receiving two identical signals of the same frequency, but the multiplication operation is not linear and the 2nd order harmonic is not the only one created; the spectrum is thus uselessly enriched.

Another type of frequency doubler is shown in FIG. 1. This figure shows a frequency doubler using full-wave rectification.

An input sine wave signal $V_e$ of frequency F is applied to the input of the device at the primary winding of a transformer 12 whose outputs are symmetric differentials relative to the mid-point of the secondary of transformer 12, connected to the anode of a diode D whose cathode is grounded. A capacitor C is connected to diode D in parallel and the two components cooperate to maintain a voltage equal to the threshold voltage of the diode on the mid-point of the secondary of transformer 12. Diode D is energized by a current with voltage +V through a resistor R. Each of the symmetric differential outputs of transformer 12 is connected to the base of bipolar transistors $T_1, T_2$. The emitters of transistors $T_1$ and $T_2$ are connected to ground and their collectors are connected to a load resistor Rc. The common point of the two transistors $T_1$ and $T_2$ (point A) is connected to the input of filter 10. The output signal Vb of the filter 10 is a sine signal whose frequency is 2F.

The frequency doubler operates as follows: the signals applied to the bases of transistors $T_1$ and $T_2$ are in phase opposition, so each transistor alternatively amplifies the input signal while the other transistor is non-conducting. Diode D and capacitor C change the threshold of the transistors to compensate their $V_{be}$. The threshold voltage of the diode is generally about 0.6 to 0.7 volts. The operation of the frequency doubler is thus a class B push-pull operation (symmetrical). Signal Va at point A is formed from juxtaposed rectified sinusoidal half-cycles, since transistors $T_1$ and $T_2$ alternatively generate one half-cycle of the sine wave. The junction between adjacent half-cycles of the sine wave is abrupt, signal Va having switching points 11 carrying very high frequency spectra. Filter 10 eliminates the base frequency F and provides the output signal Vb of frequency 2F. The gain of this arrangement is constant since the emitters are connected to ground and depend on the types of transistors $T_1$ and $T_2$ (dynamic resistance value of the emitter).

The use of several modules of this type in series enables the frequency of an input signal to be considerably increased, the first module supplying 2F at its output, the second 4F, the third 8F, and so on.

Nevertheless, since full wave rectification creates switching points 11 with very rich spectra (lines of several GHz are observed for an input signal $V_i$ of the order of 150 MHz), it is not possible to control the spectrum totally and leaks are observed, which are responsible for parasitic phenomena.

These parasitic phenomena make the device sensitive to vibrations when it is mounted in a unit which is for example part of a chain (connection in series) of frequency doublers. In addition, the parasitic frequencies may create standing waves in the unit and mechanical vibrations may modulate these waves. The shape of the output signal $V_b$ is thus considerably affected.

Furthermore, a filter to select a harmonic occupies non-negligible space in units composing a chain of frequency doublers and problems of size are common in instruments using this type of frequency doubler.

Nor is it possible to modify, at least more than slightly, the frequency of the input signal, since the filter is centered on a fixed frequency. Thus, if we wish to obtain a different output frequency from a chain of frequency doublers or change the frequency F of the basic input frequency of the chain, it is necessary to change all the filters in the frequency doublers of the chain.

An additional disadvantage arising from the presence of a filter is the increased cost of such a frequency doubler.

SUMMARY OF THE INVENTION

The purpose of the present invention is to overcome these disadvantages.

More precisely, one of the purposes of the present invention is to provide a frequency doubling device which generates few or no high order harmonics (and in which the amplitude of these harmonics is low), so that it does not require a filter to select the frequency 2F, or requires at most a less selective filter than those used in the current state of the art, and is thus less expensive.

Another purpose of the present invention is to supply such a frequency doubler which can operate in a very broad frequency range, from low frequency up to several GHz, even several tens of GHz.

An additional objective of the present invention is to provide a frequency doubler whose structure is similar to that of the frequency doubler described above with reference to FIG. 1, such that existing frequency doublers of this type can be modified easily to make them compliant with the device of the invention.

These objectives, along with others which will appear below, are attained by the use of a frequency doubler operating in particular in the microwave range, of a type including means of phase shifting enabling two signals with a phase difference of 180° to be obtained from an input signal of frequency F, and means of amplification of each of the said signals with a phase difference of 180°, the output signal of frequency 2F being formed by adding the said amplified signals, characterized by the fact that the means of amplification cooperate with means of varying the gain of the said means of amplification to render the gain of the said means of amplification practically proportional to the amplitude of the said amplified signals.

The said means of varying gain are preferably composed of diodes whose dynamic resistance varies with the voltage applied to them.

The said means of amplification are advantageously composed of bipolar transistors.

According to one mode of embodiment of the invention, the said signals with a phase difference of 180° are applied to the bases of the said transistors, the collectors of the said transistors being connected to each other, and the emitters of the said transistors are each connected to the anode of one of the said diodes, the cathodes of the said diodes being connected to each other.

Advantageously, the said transistors cooperate with the means enabling their threshold voltages to be compensated.

The said means of compensation of the threshold voltages of the said transistors preferably cooperate with a diode.

According to one mode of embodiment of the present invention, the said means of phase shifting comprise a transformer whose primary receives the said input signal of frequency F, the secondary of the said transformer having two symmetric differential outputs.

According to another mode of embodiment of the present invention, the said means of phase shifting comprise a module producing a 180° phase shift of the said input signal of frequency F, the input and output of the said module being connected to the bases of the said transistors.

The said bipolar transistors and the said diodes are preferably broad band components.

Advantageously, the frequency doubler according to the present invention is used in a frequency multiplying chain.

BRIEF DESCRIPTION OF THE DRAWINGS

Other characteristics and advantages of the present invention will appear on reading the following description of a preferred embodiment, provided as an indication and not intended to be exhaustive, with reference to the drawings, in which.

MORE DETAILED DESCRIPTION

As described above with reference to FIG. 1, the full wave rectification of an input sine wave signal of frequency F generates harmonics and a signal of frequency 2F is recovered by filtering.

The main disadvantage of devices of this type is that the harmonics of the high order spectrum can not be effectively eliminated by filtering and are responsible for parasitic phenomena.

The present invention proposes the direct generation of an output signal in the form of a sine wave whose frequency is twice the frequency of the input signal, without the necessity of an output filter.

This is why the present invention aims at the realization of a linear operation for squaring the input signal.

Mathematically, the operation consists of multiplying a signal $V_e = k.V. \sin wt$, where $w = 2.\pi.F$ and F is the frequency of signal $V_e$, by itself. The output signal is thus:

$$V_o = k'V^2 . \sin^2 wt = k'.V^2(1 - \cos 2wt)/2$$

The output signal thus contains two components: a DC component whose value is $K'V^2/2$ and a component at frequency 2F whose value is $(k'V^2 . \cos 2 wt)/2$.

The auto-product of a signal must thus be as linear as possible to avoid generating frequencies higher than second order of significant amplitude, in contrast to the situation in a ring mixer.

Figure 2:
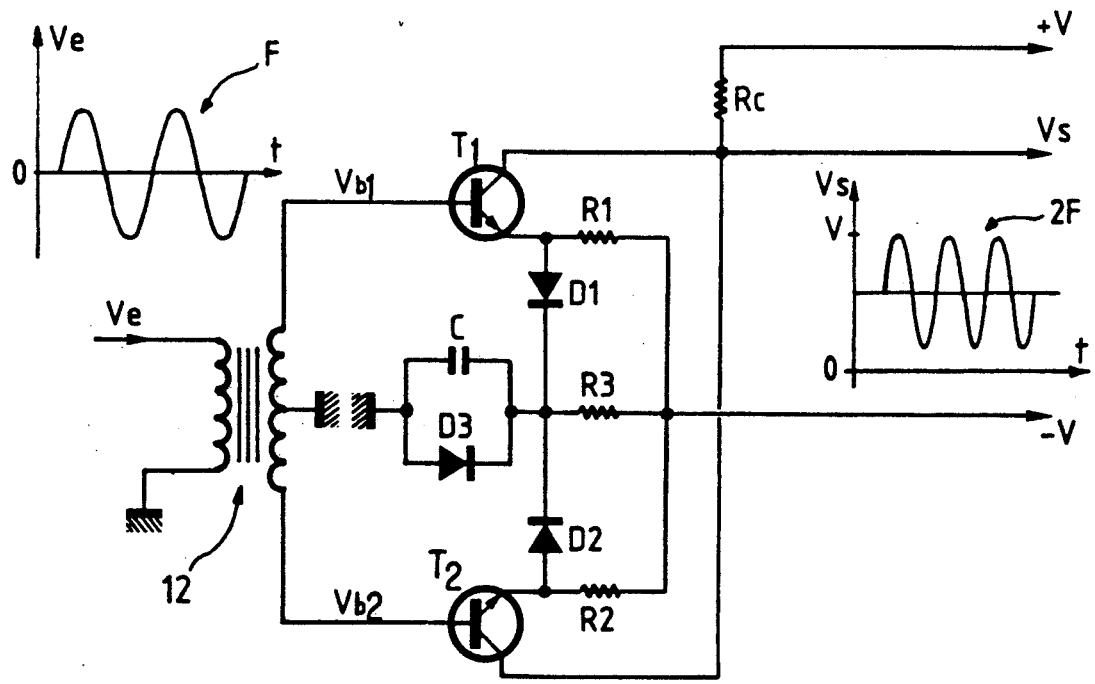
FIG. 2 represents a preferred mode of embodiment of a frequency doubler according to the present invention.

FIG. 2 represents a preferred mode of embodiment of a frequency doubler according to the present invention.

Input signal $V_e$ with frequency F is applied to the primary of a transformer 12 with two symmetric differential outputs. The mid-point of the secondary of transformer 12 is connected to ground. The circuit is energized by a positive voltage $+V$ and a negative voltage $-V$. The absolute values of these voltages may differ. Each of the differential outputs of transformer 12 is connected to the base of the means of amplification, composed of NPN bipolar transistors $T_1$ and $T_2$. The collectors of transistors $T_1$ and $T_2$ are connected to the same load resistor Rc. The transistors are polarized by a quiescent current appropriately chosen so that the amplification stage is linear. Two resistors, $R_1$ and $R_2$, define a mean current in transistors $T_1$ and $T_2$.

Since one of the purposes of the present invention is to suppress the switching points which generate undesirable frequencies, the frequency doubler includes means for varying gain cooperating with transistors $T_1$ and $T_2$ such that signals $V_{b1}$ and $V_{b2}$ applied to the bases of the two transistors are amplified as a function of their amplitude. Thus, the gain is proportional to signal amplitude and we have $V_s/V_e = k'V_e$, since $V_s/V_e = G = k'V_e$.

According to a preferred mode of embodiment of the invention, the means for varying gain are composed of two PIN diodes $D_1$ and $D_2$, making use of their dynamic resistance characteristic: the dynamic resistance of such diodes decreases when the applied voltage increases.

In FIG. 2, the anodes of diodes $D_1$ and $D_2$ are connected to the emitters of transistors $T_1$ and $T_2$ and their cathodes are connected together. Diodes $D_1$ and $D_2$ are suitably polarized and their thresholds are controlled by diode D3 which is polarized by $R_3$. Resistors $R_1$ and $R_2$ determine the mean current in transistors $T_1$ and $T_2$.

The conduction of diodes $D_1$ and $D_2$ increases as the voltage applied to them increases. The drop in their dynamic resistance increases the gain of the amplification stage. Thus, the gain of each transistor is rendered variable and proportional to the level of input signal $V_e$ by the effect of diodes $D_1$ and $D_2$, whose dynamic resistance varies with the voltage level applied. In no-load conditions, i.e. with no input signal applied, there is no voltage at the terminals of $R_1$ and $R_2$ and so only the level of the applied signal modifies the dynamic resistance of the diodes and thus the gain of the stage. When operating, the diodes are dynamically at ground as a result of the presence of capacitor C.

The first order output signal (without harmonics) sampled at the common point of the collectors of $T_1$ and $T_2$ is proportional to the square of the input signal of frequency F and thus the frequency of the output signal is directly 2F. Installing a capacitor in series (not shown) at the output eliminates the DC voltage component of the output signal.

Other modes of embodiment are of course possible. For example, the transformer 12 could be replaced by a 180° C. phase shifting circuit destined to obtain a signal whose phase is opposite that of the input signal. The input and output of such a phase shift circuit are thus connected to the bases of transistors $T_1$ and $T_2$ respectively. A hybrid T, also called a magic T, can also be used to replace this function when the frequency of the input signal can be propagated in microwave guides. The same is true of a hybrid ring.

Transistors $T_1$ and $T_2$ may also for example be PNP transistors. In this case, it is necessary to modify in particular the voltage applied to the circuit and the polarizations of the transistors.

Voltage pre-polarization of diodes $D_1$ and $D_2$ by C and D3 may be advantageously replaced by current polarization, thereby suppressing diode D3. This current polarization provides higher efficiency of the frequency doubler compared with that obtained with voltage polarization.

The value of resistors $R_1$ and $R_2$, according to one mode of embodiment of the invention, is of the order of several kW and the value of capacitor C depends on the frequency F of the input signal $V_e$. As the frequency F increases, the capacity of the capacitor decreases, so this component limits the usable frequency band.

The operation of the frequency doubler according to the invention is a class B operation, where passage from the non-conducting state of a transistor to the conducting state occurs progressively.

Figure 3:
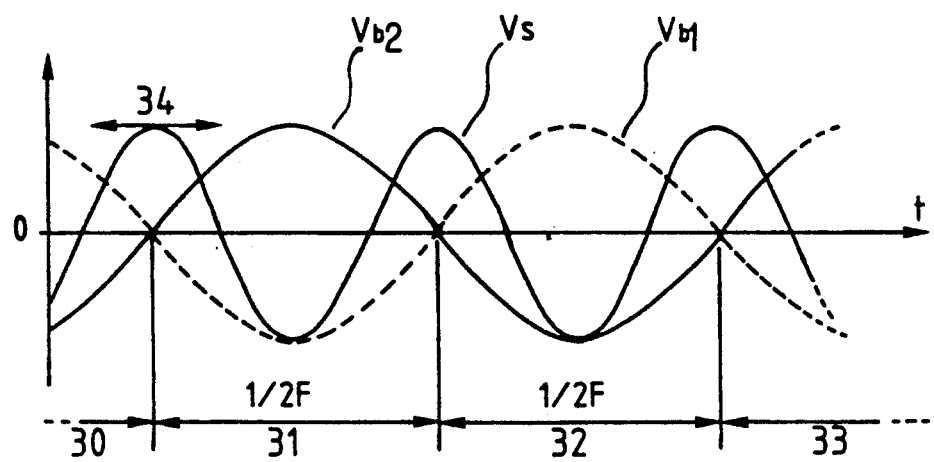
FIG. 3 represents the signals applied to the bases of transistors $T_1$ and $T_2$ and the output signal from a frequency doubler according to the present invention.

FIG. 3 represents signals $V_{b1}$ and $V_{b2}$ applied to the bases of transistors $T_1$ and $T_2$ and the output signal $V_o$ of the frequency doubler according to the invention. Signals $V_{b1}$ and $V_{b2}$ are provided by the transformer 12 of FIG. 2 and are in phase opposition.

The output signal $V_s$ shown corresponds to a signal whose DC component has been suppressed, for example with a capacitor placed in series at the output of the frequency doubler.

Figure 1:
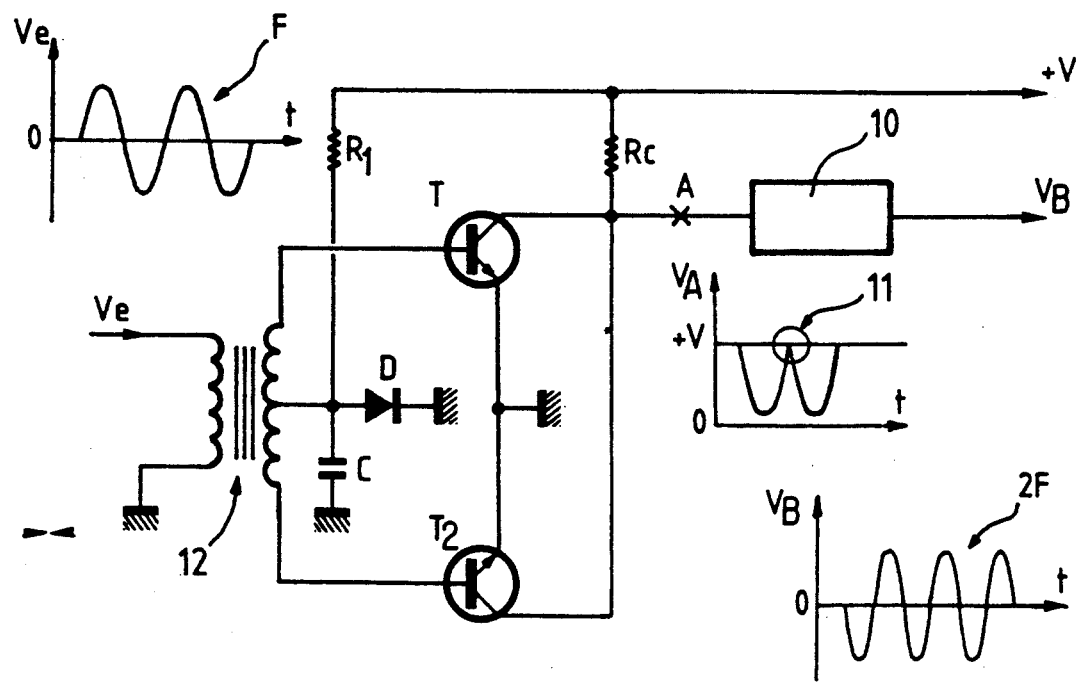
FIG. 1 represents a known type of frequency doubler functioning by full wave rectification.

According to the invention, the output signal passes from one period to the other "gently", in contrast to a sharp variation of voltage which generates high order harmonics in known frequency doublers (switching points 11, FIG. 1). This progressive variation avoids the generation of parasitic harmonics. It is achieved by progressively decreasing the gain of the conducting transistor as the voltage applied to the base of this transistor decreases.

In FIG. 3, the output signal $V_s$ is divided into four successive time periods.

During period 30, the voltage $V_{b2}$ applied to the base of transistor $T_2$ is negative, while voltage $V_{b1}$ is positive and decreasing. The conducting transistor is then $T_1$, while transistor $T_2$ is non-conducting. Since $V_{b1}$ approaches zero potential, the gain of transistor $T_1$ decreases and the dynamic resistance of diode $D_1$ increases. When $V_{b1}$ reaches zero potential, transistor $T_1$ stops conducting and transistor $T_2$ starts conducting, voltage $V_{b2}$ being positive and increasing.

During period 31, transistor $T_1$ is non-conducting and transistor $T_2$ progressively amplifies signal $V_{b2}$ applied to its base, amplification being greater as signal $V_{b2}$ increases. When $V_{b2}$ decreases and approaches zero potential, the gain of transistor $T_2$ decreases linearly with $V_{b2}$ as a result of the variation of the dynamic resistance of diode $D_2$. As $V_{b1}$ passes through zero potential, $T_2$ stops conducting and $T_1$ starts conducting (period 32). The cycle continues with period 33, where $T_1$ is non-conducting and $T_2$ is conducting, and so on until input voltage $V_e$ disappears.

It is thus seen that each of the transistors $T_1$ and $T_2$ conducts during a half-cycle of the input signal $V_e$, the beginning and end of one half-cycle corresponding to the moment when the input signal $V_e$ passes through O. At that moment, the two transistors $T_1$ and $T_2$ have null gain and switching occurs at horizontal tangent 34. This point corresponds to the former switching point 11 (FIG. 1).

Figure 4:
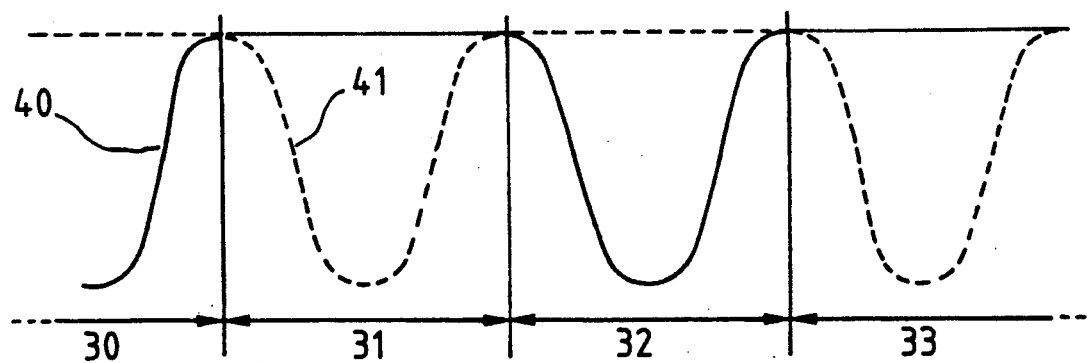
FIG. 4 represents, in correlation with FIG. 3, the output signals from transistors $T_1$ and $T_2$.

In correlation with FIG. 3, FIG. 4 represents the output signals of transistors $T_1$ and $T_2$.

Signal 40 is that appearing on the collector of transistor $T_1$ and signal 41 that of the collector of transistor $T_2$. When one of the two transistors has finished conducting, it is in the non-conducting state while the other transistor is conducting. Since the two transistors $T_1$ and $T_2$ are connected, the output signal also contains a DC component which can be eliminated by simple filtering, for example with a capacitor mounted in series at the output.

The two amplification channels are totally independent, each transistor operating during one half-cycle without the other having any influence whatsoever on its operation.

Transistors $T_1$ and $T_2$ are advantageously paired transistors, i.e. having the same characteristics, so that the end of conduction of one of the transistors corresponds to the beginning of conduction of the other transistor and so that their amplification is the same. The same is true of the diodes whose dynamic resistance varies as a function of voltage (PIN diodes) used to make the transistors progressively conducting and non-conducting.

The characteristics of the transistors and diodes used are a function of the operating frequency required. As the frequency F of the input signal increases, transistors $T_1$ and $T_2$ and diodes $D_1$ and $D_2$ should be more rapid.

One of the advantages of the frequency doubler of the invention is that the energy of the output signal $V_s$ is almost equal to that of the input signal $V_e$, i.e. the doubler has an excellent efficiency. This enables several stages with the same characteristics to be cascaded, the characteristics of the transistors and diodes being adapted, of course, as a function of the operating frequency of each stage.

A selection filter for a harmonic is not required because of the progressive onset of conduction by the transistors, the unfiltered output signal displaying harmonics with amplitudes at least 25 dB less than that of the frequency 2F. The shape of the output signal is almost sinusoidal.

The input signal $V_i$ can of course be a non-sinusoidal, e.g. saw-tooth, square, etc.

There are numerous fields of application for the frequency doubler according to the invention. It may for example be used in frequency standards, in measurement synthesizers (fixed frequency generators), in network analyzers, in frequency meters, radars, in telecommunications transmission and reception, in spectral analyzers and in general wherever the frequency of a wave must be doubled efficiently, in terms of amplitude and spectral quality (noise, harmonics).

In addition, in the case of applications not requiring a filter, the frequency doubler of the invention is advantageously adapted for use in applications where space is a problem and it may be easily implanted in a device utilizing MMIC (monolithic microwave integrated circuit) technology.

This absence of a filter in particular enables the frequency doubler according to the invention to be used for frequencies different from those for which it was calculated, while at the same time remaining in a range of input frequencies leading to an output signal of double frequency with good characteristics. This is a useful feature when a given variation in output frequency is desired without having to modify an entire chain of frequency doublers.

Furthermore, its structure is close to that of the current state of the art (FIG. 1), enabling existing frequency doublers to be easily modified to make them comply with the present invention. It is of course possible to integrate the present invention in any existing frequency doubler chain, as a replacement or complement of other doublers.

What is claimed is:

1. A frequency doubler operating in particular in the microwave range, receiving a periodic input signal $V_c$ of frequency F and generating an output signal $V_s$ of frequency 2F, twice that of the input signal, of a type including means for phase shifting two signals $V_{b1}$ and $V_{b2}$ of frequency F to be generated from the input signal $V_e$, the two signals having a phase difference of 180° between them, characterized by the fact that the frequency doubler includes two amplifiers, $T_1$ and $T_2$, both connected to the same output supplying the output signal $V_s$, each amplifier having zero gain during one half-cycle of the periodic input signal and having means connected to said amplifiers for varying the gain in proportion to the input signal during the other half-cycle of the periodic input signal, the amplifier $T_1$ receiving the first signal $V_{b1}$ and the amplifier $T_2$ receiving the second signal $V_{b2}$;

wherein said means for varying the gain include diodes whose dynamic resistance varies in response to the input signal applied to the diodes.

2. A frequency doubler according to claim 1, characterized by the fact that said two amplifiers are bipolar transistors.

3. A frequency doubler according to one of claims 1 and 2, characterized by the fact that said signals with a phase difference of 180° are applied to the bases of said transistors, the collectors of said transistors being connected to each other, and that the emitters of said transistors are each connected to the anode of said diodes, the cathodes of said diodes being connected to each other.

4. A frequency doubler according to claim 2, characterized by the fact that said means for varying the gain cooperate with means for compensating threshold voltages of said transistors.

5. A frequency doubler according to claim 4, characterized by the fact that the means for compensating the threshold voltages of said transistors include a diode.

6. A frequency doubler according to claim 1, characterized by the fact that the means of phase shifting are composed of a transformer whose primary receives the input signal of frequency F, the secondary of the transformer containing two symmetric differential outputs.

7. A frequency doubler according to any one of claims 1, 2 and 4–6, characterized by the fact that the means for phase shifting are composed of a module which shifts the phase of the input signal of frequency F by 180°, the input and output of said phase shifting module being connected respectively to the bases of said transistors.

8. A frequency doubler according to any one of claims 2, 4 and 5, characterized by the fact that said transistors and said diodes are broad band components.

9. A frequency doubler according to any one of claims 1, 2 and 4–6 included in a chain of frequency multiplication.

* * * * *